(12) United States Patent
Hirakawa et al.

(10) Patent No.: US 7,586,321 B2
(45) Date of Patent: Sep. 8, 2009

(54) ELECTRICAL TEST PROBE AND ELECTRICAL TEST PROBE ASSEMBLY

(75) Inventors: Hideki Hirakawa, Aomori (JP); Akira Soma, Aomori (JP); Takayuki Hayashizaki, Aomori (JP); Shinji Kuniyoshi, Tokyo (JP)

(73) Assignee: Kabushiki Kaisha Nihon Micronics, Musashino-shi, Tokyo (JP)

( * ) Notice: Subject to any disclaimer, the term of this patent is extended or adjusted under 35 U.S.C. 154(b) by 0 days.

(21) Appl. No.: 11/847,082

(22) Filed: Aug. 29, 2007

(65) Prior Publication Data

US 2008/0074128 A1  Mar. 27, 2008

(30) Foreign Application Priority Data

Sep. 26, 2006  (JP) ............................. 2006-259952
Oct. 2, 2006   (JP) ............................. 2006-270543

(51) Int. Cl.
*G01R 31/02* (2006.01)
(52) U.S. Cl. ..................... 324/762; 324/754
(58) Field of Classification Search .................. 324/762
See application file for complete search history.

(56) References Cited

U.S. PATENT DOCUMENTS 4,034,293 A * 7/1977 Roch ........................ 324/762

6,504,388 B2 * 1/2003 Comulada et al. ........... 324/754
6,794,890 B1 * 9/2004 Tokumo et al. ............. 324/761

FOREIGN PATENT DOCUMENTS

| EP | 1624308 A1 * | 2/2006 |
| EP | 1724594 A1 * | 11/2006 |
| WO | WO 2005085877 A1 * | 9/2005 |
| WO | WO2006/075408 A1 | 7/2006 |

* cited by examiner

*Primary Examiner*—Ha Tran T Nguyen
*Assistant Examiner*—Roberto Velez
(74) *Attorney, Agent, or Firm*—Ingrassia Fisher & Lorenz, P.C.

(57) ABSTRACT

An electrical test probe comprises a probe tip portion and a probe main body portion having a pedestal portion on which the probe tip portion is formed to be protruded. The probe main body portion is made of a conductive material that is greater in toughness than the probe tip portion, and the probe tip portion is made of a conductive material that is higher in hardness than the material of the probe main body portion. On the pedestal portion is provided a probe tip reinforcement portion that contacts at least one side surface of the probe tip portion, extends toward a tip of the probe tip portion, and permits the tip of the probe tip portion to be protruded from its extending end in the extending direction. Also, the probe tip portion may be in a multi-layer structure having a first metal material layer that is higher in hardness than the tough metal material forming the probe main body portion and a second metal material layer that is greater in toughness than the first metal material layer.

10 Claims, 12 Drawing Sheets

(a)      (b)      (c)

ELECTRICAL TEST PROBE AND ELECTRICAL TEST PROBE ASSEMBLY

BACKGROUND OF THE INVENTION

The present invention relates to an electrical test probe suitable for use in an electrical test of a plurality of semiconductor integrated circuits formed on a semiconductor wafer and a prove assembly into which this probe is incorporated.

A plurality of semiconductor integrated circuits formed on a semiconductor wafer generally undergo an electrical test before being separated into respective chips to determine whether or not they are manufactured in accordance with the specification. In this electrical test is used a probe assembly comprising electrical test probes to be connected to electrodes of devices under test, that is, the respective semiconductor integrated circuits. The devices under test are connected to a tester via this probe assembly.

One of the conventional probes used for this probe assembly is one comprising a plate-shaped probe main body portion and a probe tip portion provided on the probe main body portion to contact an electrode of a device under test (for example, refer to International PCT Publication WO2006/075408, hereinafter "Patent Document 1"). The probe main body portion has an attachment portion to a probe board, a pair of arm portions extending from the attachment portion to the lower side of the probe board laterally along the probe board with a space from the probe board, and a pedestal portion formed integrally with the arm portions so as to combine the ends of the both arm portions, and the aforementioned probe tip portion is provided on the pedestal portion. According to Patent Document 1, it is proposed that the probe main body portion should be made of a highly flexible or tough conductive material, and the probe tip portion provided at the lower end of the pedestal portion of the probe main body portion should be made of a metal material with excellent hardness.

By making the probe main body portion of the highly tough metal material, elastic deformation of the arm portions of the probe main body portion is enhanced when the probe tip portion of the probe is thrust upon the electrode of the device under test, which enables the probe tip portion to connect the electrode appropriately and reliably. Also, when an overdrive force that causes the aforementioned elastic deformation at the arm portions of the probe acts on the probe, the tip of the probe tip portion slides on the electrode along with the elastic deformation of the arm portions. By forming this probe tip portion by the highly hard material, abrasion of the tip is suppressed, and decrease in durability of the probe caused by the abrasion is prevented.

Meanwhile, in a case where one wafer surface is divided into plural chip areas, and an electrical test is performed per divided area by using the conventional probe assembly, the tips of some probes that deviate from the chip area may sometimes contact the tilting edge of the wafer in a state where the overdrive force acts on the probes. In such a case, when the tips are guided outward along the tilting edge of the wafer, a bending force acts on the probe tip portions of the probes. Also, when the tip of the probe contacts the edge of the opening edge portion, which exposes the electrode, of the passivation film covering the surface of the semiconductor wafer, the similar bending force may act on the probe tip portion. Since these bending forces may cause breakage of the probe tip portion made of the highly hard material, it has been desired that the probe tip portion should be reinforced against such bending forces.

Also, as the fine probe tip portion protruded from the lower surface of the pedestal portion is made of the highly hard metal material, the fragility of the probe tip portion may cause defect or breakage when a load is applied to the tip of the probe tip portion. Thus, it has been desired that the defect or breakage of the probe tip portion should be reliably prevented.

Patent Document 1: International Publication WO2006/075408

BRIEF SUMMARY OF THE INVENTION

It is an object of the present invention to reinforce the probe tip portion in order to prevent breakage of the probe tip portion.

It is another object of the present invention to prevent defect or breakage of the probe tip portion and enhance durability of the probe.

A first invention is an electrical test probe comprising a probe tip portion and a probe main body portion having a pedestal portion on which the probe tip portion is formed to be protruded, wherein the probe main body portion is made of a conductive material that is greater in flexibility or toughness than the probe tip portion, and the probe tip portion is made of a conductive material that is higher in hardness than the material of the probe main body portion, and wherein on the pedestal portion is provided a probe tip reinforcement portion that abuts on at least one side surface of the probe tip portion to extend toward a tip of the probe tip portion, and allows the tip of the probe tip portion to be protruded from its extending end in the extending direction.

In the first invention, the probe tip reinforcement portion of the probe main body portion is formed along the probe tip portion on at least one side surface of the probe tip portion and allows the tip of the probe tip portion to be protruded from the reinforcement portion. Thus, when the probe tip portion receives a bending force directed toward the probe tip reinforcement portion, the probe tip reinforcement portion bears a part of a reactive force of this bending force without preventing the tip from contacting an electrode. As a result, it has a reliable reinforcement effect.

The probe tip reinforcement portion may be made of the same material as that of the pedestal portion and may be formed integrally with the pedestal portion. By making the probe tip reinforcement portion integrally with the pedestal portion of the same material as that of the pedestal portion, the probe tip reinforcement portion may be formed at the same time of formation of the probe main body portion. Thus, the probe tip reinforcement portion can be formed without adding new additional steps in the manufacturing process.

The probe tip reinforcement portion may be fixed to the probe tip portion. By fixing the probe tip reinforcement portion to the probe tip portion, it is possible to allow the probe tip reinforcement portion to exert its reinforcement effect against not only the aforementioned bending force toward the probe tip reinforcement portion but also a bending force acting on the probe tip portion directed in the opposite direction of this bending force to a direction distanced from the probe tip reinforcement portion.

The probe main body portion may be constituted by a plate-shaped member. In such a case, the internal side of the probe tip reinforcement portion may be arranged along the probe tip portion, and its external side may be arranged to correspond to one side surface of the probe main body portion.

On the tip of the probe tip portion may be formed a flat surface approximately perpendicular to the extending direction of the tip. In such a case, an end surface of the reinforcement portion located on the tip side of the probe tip portion may be a curved surface.

When the flat surface of the tip is used as an alignment mark for alignment of a probe assembly, reflected light from this alignment mark is captured by a camera, and alignment of the probe assembly is performed based on this alignment mark image. At this time, if reflected light from the probe tip reinforcement portion is captured by the aforementioned camera, this causes prevention of accurate recognition of the alignment mark. However, forming the end surface of the probe tip reinforcement portion to be a curved surface prevents the reflected light from the end surface of the probe tip reinforcement portion from being captured by the aforementioned camera for alignment, as described above. Thus, since the end surface of the probe tip reinforcement portion can be prevented from being mistakenly recognized as an alignment mark, it is possible to prevent accurate alignment of the probe assembly from being interfered by the probe tip reinforcement portion.

When the tip of the probe tip portion has a flat surface approximately perpendicular to the extending direction, an angular tilting surface with respect to the flat surface of the tip is given to the end surface of the probe tip reinforcement portion located on the tip side of the probe tip portion. By doing so, it is possible to prevent the probe tip reinforcement portion from interfering with alignment in the same manner as above.

The probe tip portion may be formed with a part of it buried in the pedestal portion.

The probe main body portion may be constituted by an attachment portion similar to a conventional one, a pair of arm portions extending in a lateral direction from the attachment portion to be distanced from each other in a height direction of the attachment portion, and a pedestal portion connected to the arm portions.

A second invention is an electrical test probe comprising a probe main body portion made of a flexible metal material and a probe tip portion provided on the probe main body portion, wherein the probe tip portion is in a multi-layer structure having a first metal material layer that is higher in hardness than the flexible metal material forming the probe main body portion and a second metal material layer that is greater in flexibility than the first metal material layer.

In the second invention, the probe tip portion is in a multi-layer structure having the first highly hard metal material layer and the second metal material layer that is greater in flexibility than the first metal material layer. Thus, flexibility that the first highly hard metal material layer lacks is supplemented with the second metal material layer. Accordingly, since a probe having a probe tip portion with excellent abrasion resistance and without generation of defect or breakage is provided, its durability is enhanced.

The probe main body portion may be constituted by a plate-shaped member, and the probe tip portion may be in a multi-layer structure layered in a plate thickness direction of the probe main body portion. Thus, the probe according to the present invention can be formed relatively easily by using a photolithography technique and an electroplating method, for example.

The second metal material layer may be made of the flexible metal material forming the probe main body portion. By using the same material for the second metal material layer and the probe main body portion, the probe main body portion can be integrated with the second metal material layer of the probe tip portion. Thus, manufacturing facilities for the probe can be simplified, and the mechanical combination strength between the probe main body portion and the probe tip portion can be increased.

The thickness dimension of the first metal material layer is preferably greater than that of the second metal material layer. Accordingly, it is possible to provide the probe tip portion with required abrasion resistance more reliably.

A pedestal portion on which the probe tip portion is provided may be formed on the probe main body portion, and the second metal material layer of the probe tip portion may be made of the same material as that of the pedestal portion and may be formed integrally with the pedestal portion. By using the same metal material in this manner as well, the probe main body portion can be integrated with the second metal material layer of the probe tip portion. Thus, manufacturing facilities for the probe can be simplified, and the mechanical combination strength between the probe main body portion and the probe tip portion can be increased.

The probe tip portion may be in a sandwich-like multi-layer structure having the first metal material layer and a pair of the second metal material layers covering both surfaces of the metal material layer. In such a case, since both surfaces of the first highly hard metal material layer are covered with the second metal material layers with excellent flexibility, the first metal material layer between the second metal material layers hardly suffers external scratches that cause breakage or defect, and it is possible to prevent decrease in durability due to the fragility of the probe tip portion effectively.

The probe main body portion may be constituted by an attachment portion similar to a conventional one, a pair of arm portions extending in a lateral direction from the attachment portion to be distanced from each other in a height direction of the attachment portion, and a pedestal portion connected to the arm portions. The pedestal portion is formed to extend to the opposite side of a side where the attachment portion is located, as seen from the arm portions, so as to connect extending ends of the arm portions, and the probe tip portion is formed on an extending end of the pedestal portion.

The probe according to the first or second invention may be mounted in a conventional electrical test probe assembly.

According to the first invention, since a probe tip reinforcement portion formed on a pedestal portion of a probe main body portion exerts a part of a reactive force of a bending force acting on a probe tip portion provided on the pedestal portion without preventing a tip of the probe tip portion from contacting an electrode as described above, it can reinforce the probe tip portion reliably.

According to the second invention, as a probe tip portion is in a multi-layer structure having a first highly hard metal material layer and a second metal material layer with excellent toughness, the features of both the metal material layers can be utilized effectively. Thus, it is possible to enhance abrasion resistance of the probe tip portion of the probe, prevent its defect or breakage, and improve durability of the probe.

BRIEF DESCRIPTION OF THE DRAWINGS

FIG. 9(a) shows an embodiment of a three-layer structure, FIG. 9 (b) shows an embodiment of a five-layer structure, and FIG. 9(c) shows an embodiment of a two-layer structure.

FIG. 11(a) shows an embodiment of a two-layer structure.

DESCRIPTION OF THE PREFERRED EMBODIMENTS

Figure 1:
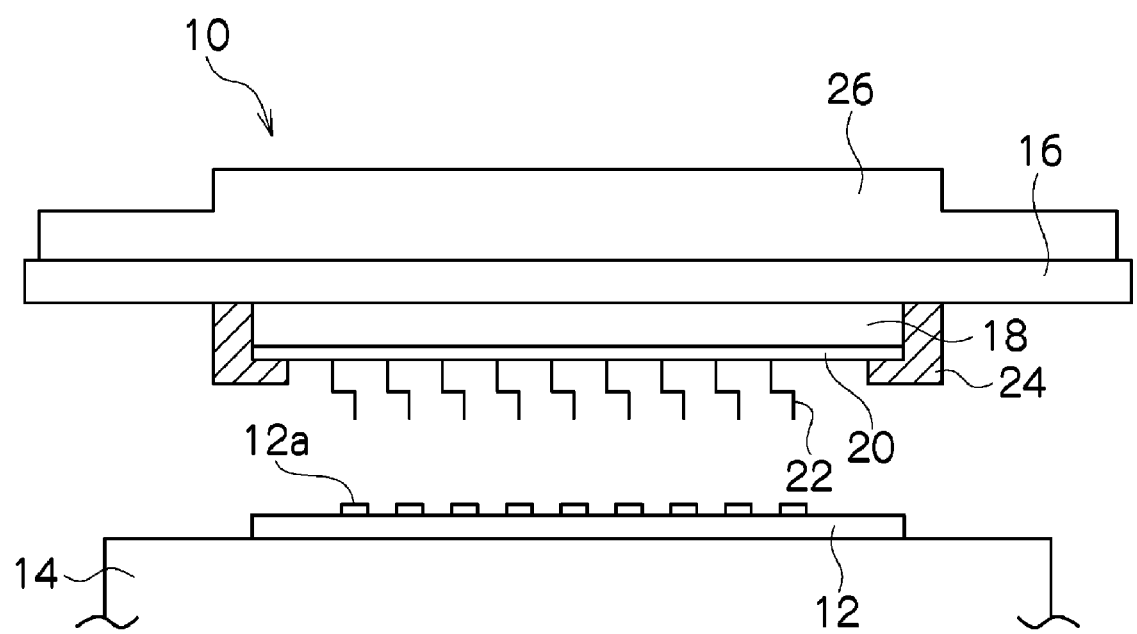
FIG. 1 is a schematic view partially showing a probe assembly having a probe in which a reinforcement portion according to a first invention is provided.

Hereinafter, a first invention will be described with reference to FIGS. 1 to 6. A probe assembly 10 according to the present invention is used for an electrical test of a plurality of integrated circuits (not shown) formed on a semiconductor wafer 12 as shown in FIG. 1. The semiconductor wafer 12 is removably held on a vacuum chuck 14, for example, with a plurality of electrodes 12a formed on its one surface directing upward. The probe assembly 10 is supported by a frame member (not shown) to be movable relatively to the vacuum chuck 14 in directions approaching and distanced from the semiconductor wafer 12 on the vacuum chuck 14 for the electrical test of the aforementioned integrated circuits of the semiconductor wafer 12 on the vacuum chuck 14.

The probe assembly 10 comprises a printed wiring board 16 and a probe board 20 piled up on the printed wiring board 16 via a ceramic board 18. On one surface of the probe board 20 are arranged and attached a plurality of probes 22 according to the present invention. The ceramic board 18 and the probe board 20 are attached to the printed wiring board 16 so as to be piled on the lower surface of the printed wiring board 16 via a conventionally-well-known attachment ring assembly 24 made of a dielectric material such as a ceramic so that the probes 22 attached to the probe board direct downward.

On the upper surface of the printed wiring board 16 is arranged a reinforcement member 26 that is made of a metal material and allows partial exposure of the aforementioned upper surface of the printed wiring board 16. The probe board 20, the ceramic board 18, the printed wiring board 16, the reinforcement member 26, and the attachment ring assembly 24 are integrally combined by combining members (not shown) similar to conventional ones such as bolts.

In the probe board 20 are formed not shown conventionally well-known conductive paths. The probes 22 are attached to the probe board 20 so that they are fixedly connected to the aforementioned corresponding conductive paths. The aforementioned respective conductive paths in the probe board 20 corresponding to the probes 22 are electrically connected to sockets (not shown) arranged in an area exposed from the reinforcement member 26 on the upper surface of the printed wiring board 16 via respective conductive paths (not shown) respectively penetrating the ceramic board 18 and the printed wiring board 16 as in a conventionally well-known manner and are connected to a circuit of a tester main body (not shown) via the sockets.

Accordingly, by letting the probe assembly 10 and the vacuum chuck 14 move so as to approach each other so that the respective probes 22 of the probe assembly 10 contact the corresponding electrodes 12a on the semiconductor wafer 12 as a device under test, the electrodes 12a can be connected to the circuit of the aforementioned tester main body, and thus an electrical test of the device under test 12 can be performed.

Figure 2:
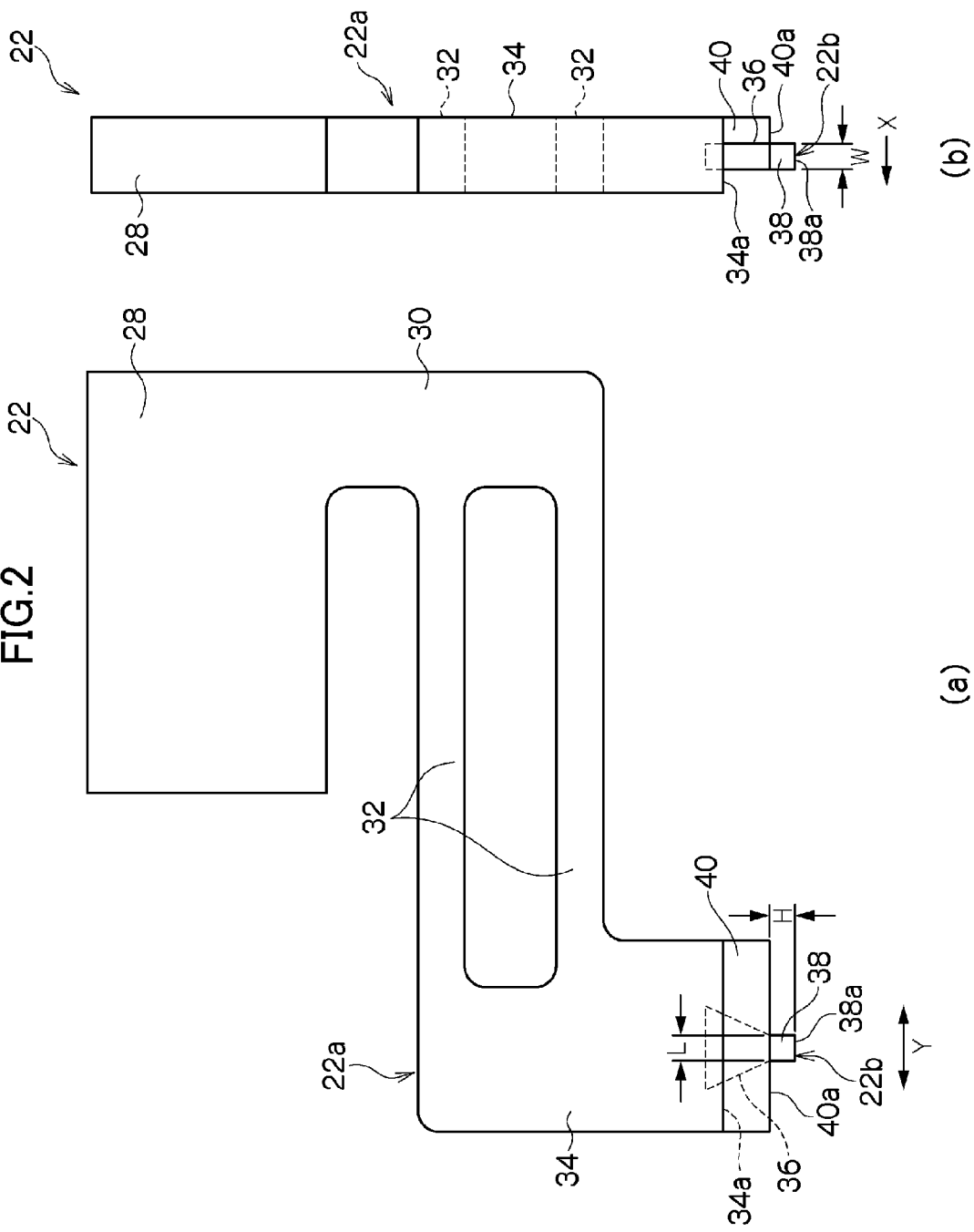
FIG. 2(a) is an enlarged front view of the probe according to the first invention shown in FIG. 1.
FIG. 2(b) is its enlarged side view.

Referring to FIG. 2, which is an enlarged view of each probe 22, each probe 22 comprises a plate-shaped probe main body portion 22a made of a metal material such as nickel or a nickel-chromium alloy and a probe tip portion 22b made of a hard metal material such as rhodium. Both portions 22a and 22b, made of these metal materials, have relatively good conductivity. Also, as for the features of both portions 22a and 22b, made of these metal materials, the probe main body portion 22a is greater in toughness than the probe tip portion 22b while the probe tip portion 22b is higher in hardness than the probe main body portion 22a.

The probe main body portion 22a may be made of a highly tough metal material with excellent toughness such as a nickel alloy including, for example, a nickel-phosphorus alloy, a nickel-tungsten alloy, and a nickel-cobalt alloy, phosphor bronze, or a palladium-cobalt alloy, instead of the aforementioned metal material. Also, the probe tip portion 22b may be arbitrarily made of a highly hard metal material other than rhodium.

In the example shown in the figure, the probe main body portion 22a comprises a rectangular attachment portion 28 whose lateral direction is a longitudinal direction, a connection portion 30 extending downward from one side of the attachment portion, arm portions 32, 32 extending in a lateral direction from the connection portion with a space along the lower edge of the attachment portion 28, and a pedestal portion 34 connected to the extending ends of the arm portions. Also, in the example shown in the figure, a pair of arm portions 32, 32 formed to be distanced from each other in a height direction of the attachment portion 28, that is, an extending direction of the connection portion 30, is formed as the arm portions. The pedestal portion 34 connecting the extending ends of both arm portions 32, 32 extends to the opposite side of a side where the attachment portion 28 is located, when seen from the pair of arm portions 32.

The extending end of this pedestal portion 34 is a flat end surface 34a, and the probe tip portion 22b is provided to be protruded from this end surface. The probe tip portion 22b comprises a base portion 36 having a trapezoidal flat surface shape whose dimension in a lateral direction gradually decreases toward the protruding direction and a column body portion 38 having a rectangular flat surface shape extending from the shorter side of a parallel opposite sides pair of the base portion, as shown in FIG. 2(a). The tip surface of this column body portion 38 is a flat surface 38a perpendicular to the axis line of the column body portion 38. For example, the height dimension H of the column body portion 38 is 28±3 μm, the width dimension W is 14.5±2 μm or 12.5±1.5 μm, and the lateral direction dimension L is 15±2 μm. These dimensions H, W, and L can be selected arbitrarily.

Also, the thickness dimension of the probe tip portion 22b is 14.5±2 μm or 12.5±1.5 μm, and the thickness dimension of the probe main body portion 22a is 43±2 μm or 38±2 μm.

These thickness dimensions can be selected arbitrarily. As for this probe tip portion 22b, the edge portion including the longer side of the aforementioned parallel opposite sides pair of the base portion 36 is buried in the pedestal portion 34 of the probe main body portion 22a such that the probe tip portion 22b is located approximately at the center of the probe main body portion, when seen in a thickness direction of the probe main body portion 22a.

In the probe 22 according to the present invention, a probe tip reinforcement portion 40 is formed integrally with the probe main body portion 22a, for example, so that its internal surface abuts on one side surface of the probe tip portion 22b. In the example shown in FIG. 2, the probe tip reinforcement portion 40 extends in a downward direction from the end surface 34a of the pedestal portion 34 in a range from one end to the other end of the end surface 34a in a lateral direction of the end surface 34a along the side surface of the probe tip portion 22b on one side of the probe tip portion 22b and thus has a rectangular flat surface shape. Thus, a lower surface 40a of the probe tip reinforcement portion 40 is constituted by a flat surface parallel to the end surface 34a of the pedestal portion 34.

This flat surface 40a is located at a higher position than the tip surface 38a of the column body portion 38 of the probe tip portion 22b. Thus, since the column body portion 38 of the probe tip portion 22b passes over the lower surface 40a of the probe tip reinforcement portion 40 and is protruded downward beyond its lower side, the tip surface 38a of the column body portion 38, that is, the probe tip surface, is protruded downward beyond the lower side of the probe tip reinforcement portion 40.

Also, the probe tip reinforcement portion 40 is formed such that its external surface corresponds to one side surface of the probe main body portion 22a. The aforementioned internal surface of this probe tip reinforcement portion 40 abuts on one side surface of the probe tip portion 22b as described above. When the probe tip portion 22b receives an action force directed toward the probe tip reinforcement portion 40, the probe tip reinforcement portion 40 exerts a part of a reactive force of this action force. Thus, it has a reinforcement effect on the probe tip portion 22b.

When the probe tip portion 22b receives an action force directed in the opposite direction of the action force directed toward the probe tip reinforcement portion 40, that is, an action force X to the thickness direction distanced from the probe tip reinforcement portion 40, or when the probe tip portion 22b receives an action force Y to the lateral direction perpendicular to the aforementioned action force along the probe tip reinforcement portion 40, the probe tip reinforcement portion 40 can be fixed on the aforementioned side surface of the probe tip portion 22b in order to exert a part of its reactive force.

The probe 22 according to the present invention is fixed on the probe board 20 such that the upper edge of the attachment portion 28 is connected to the aforementioned conductive path in the probe board 20. Accordingly, each probe 22 is cantilevered by the probe board 20. The probe assembly 10 in which this probe 22 has been provided is used so that the tip surface 38a of the probe tip portion 22b, which is a probe tip of each probe 22, may abut on the corresponding electrode 12a, as described above.

Figure 3:
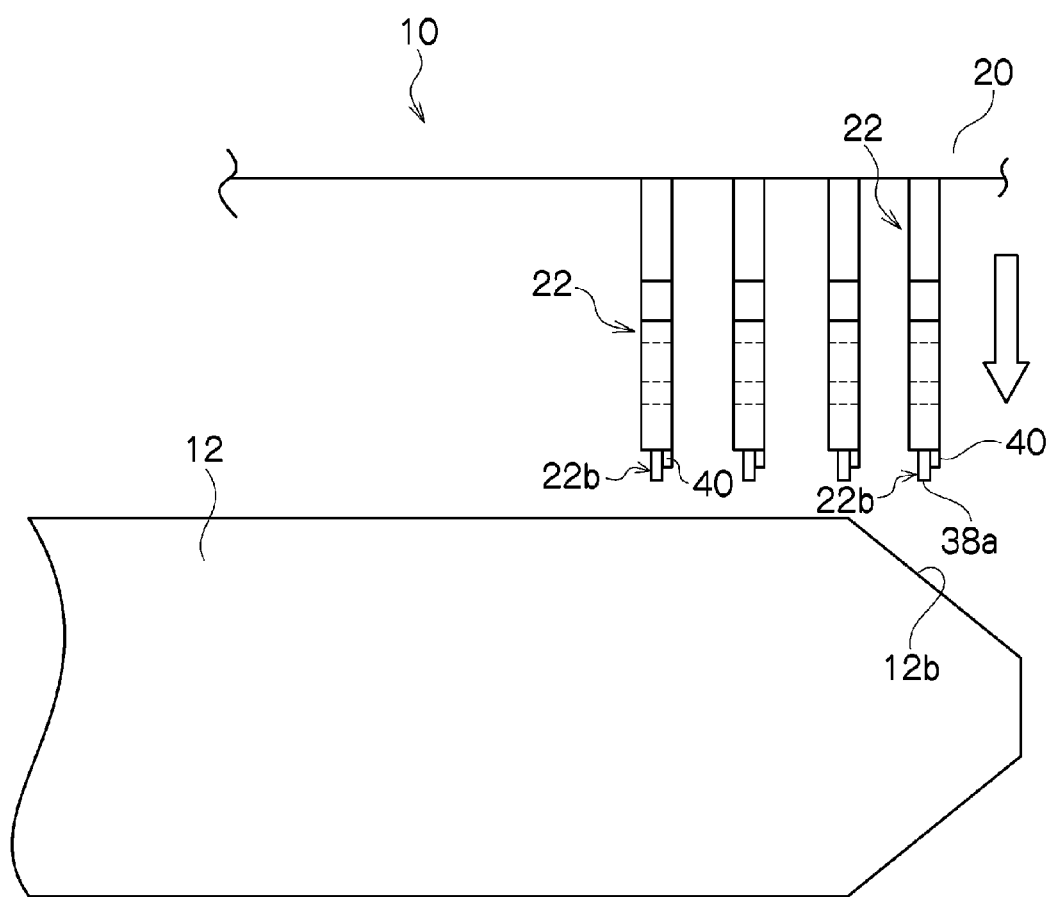
FIG. 3 shows the relationship between a semiconductor wafer to be tested by the probe assembly shown in FIG. 1 and the probes.

In a case where one semiconductor wafer 12 is divided into plural chip areas, and each chip area undergoes an electrical test by the probe assembly 10, it sometimes occurs that some probes 22 deviate from the chip area and that the probe tips 38a of the probes 22 come to a position corresponding to a tilting edge 12b of the semiconductor wafer 12, as shown in FIG. 3. When the probe assembly 10 is thrust into the semiconductor wafer 12 by an overdriving force that causes elastic deformation of the arm portions 32 of each probe 22 in such a state, the tip surface 38a of the probe 22 corresponding to the tilting edge 12b is guided by the tilting edge 12b. Due to this guide effect of the tilting edge 12b, a relatively strong bending force toward the probe tip reinforcement portion 40, for example, acts on the probe tip portion 22b of this probe 22.

However, in the probe 22 according to the present invention, each probe tip portion 22b is reinforced by its own probe tip reinforcement portion 40. Thus, the probe 22 is not broken by such a bending force, and durability of the probe 22 and the probe assembly 10 to which the probe is provided is enhanced.

Figure 4:
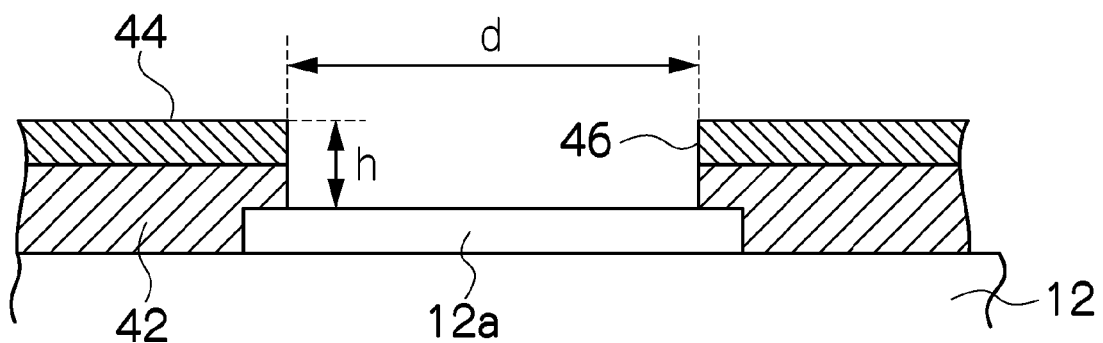
FIG. 4 is an enlarged cross-sectional view showing a structure of a pad on the semiconductor wafer.

FIG. 4 shows an example in which a passivation film 42 such as an oxide silicon film or a silicon nitride film and a protection film 44 such as a polyimide film covering the passivation film are formed on the semiconductor wafer 12 so as to cover the surface of the semiconductor wafer 12 and the edge portion of the electrode 12a formed on the surface. In each of the films 42, 44 is formed an opening 46 of a rectangular shape, for example, that allows exposure of the electrode 12a. In general, a distance d of one side of the opening 46 is 50 to 100 μm, and its height h is 5 to 10 μm. In a case where the probe tip portion 22b of the aforementioned probe 22 is to abut on the corresponding electrode 12a in an electrical test for such a semiconductor wafer 12, when the probe tip portion 22b is engaged with the edge portion of the opening 46, a strong bending force acts on the probe tip portion 22b. The probe tip reinforcement portion 40 according to the present invention exerts a reinforcement effect on the probe tip portion 22b effectively against such an action force.

Figure 5:
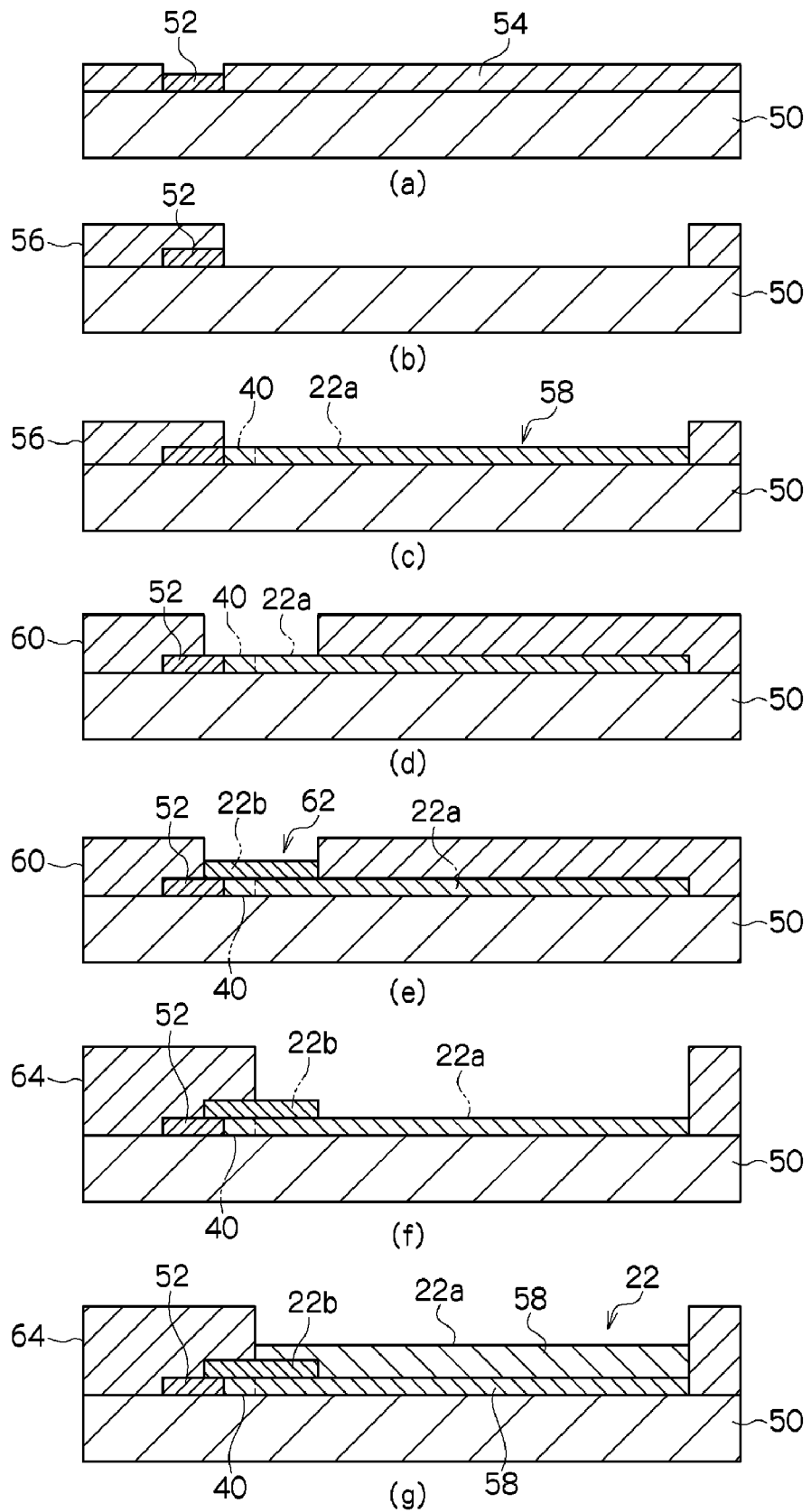
FIG. 5 shows a manufacturing process for the probe shown in FIG. 2.
Figure 6:
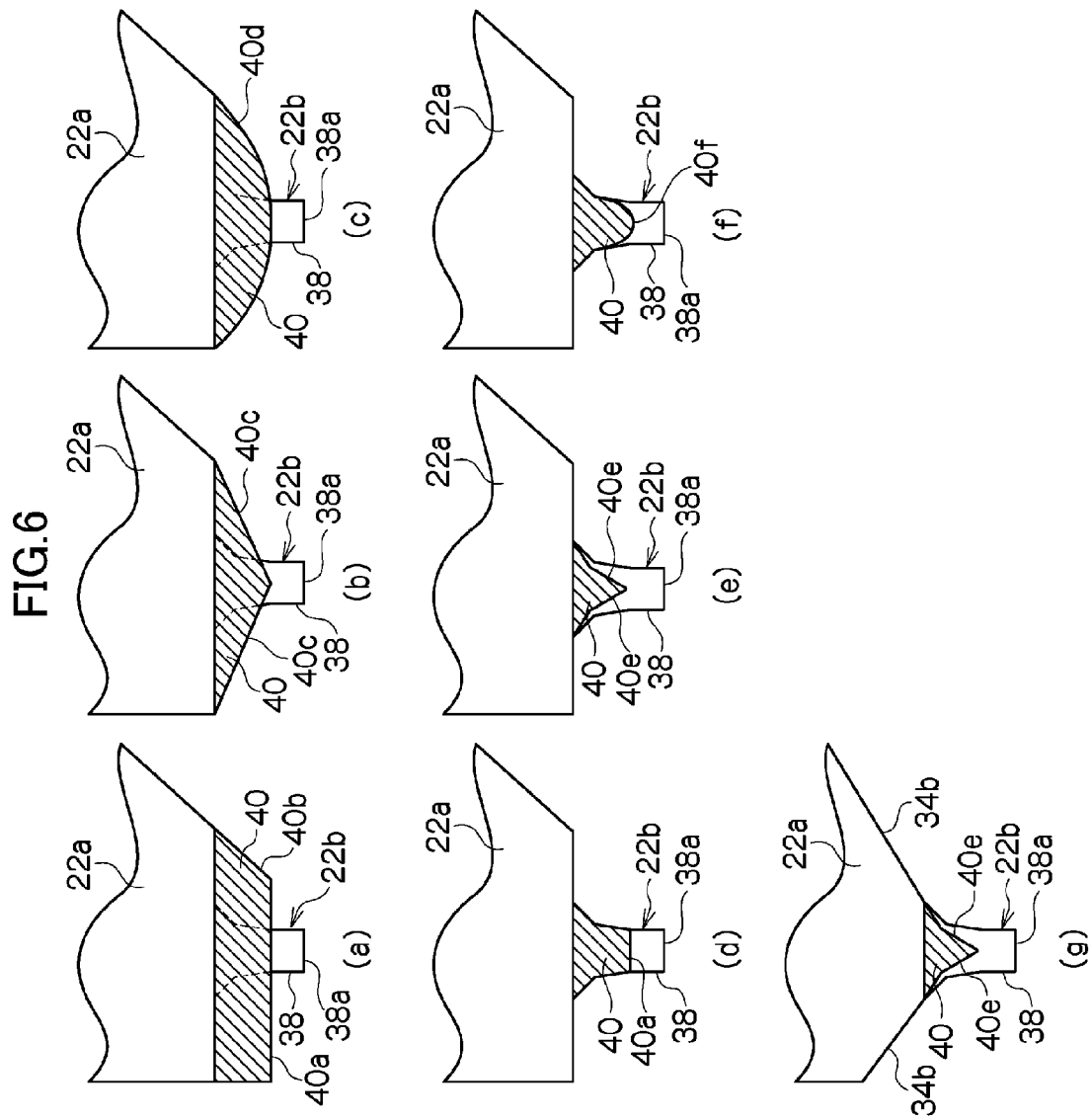
FIGS. 6(a) to (g) show other embodiments of the first invention, which are modification examples of the reinforcement portion according to the first invention.

An example of a method for manufacturing the probe 22 is explained with reference to the manufacturing process shown in FIG. 5. As shown in FIG. 5(a), a photolithography mask 54 for a sacrificial layer 52 to be removed later is formed on a stainless-steel base table 50 having a flat surface through a conventionally well-known selective exposure and development process to a photoresist layer. A sacrificial layer material such as nickel is deposited on the surface portion of the base table 50 exposed from the photolithography mask 54 with predetermined thickness by an electroplating method, as a result of which the sacrificial layer 52 is formed.

After the photolithography mask 54 is removed, a new second photolithography mask 56 is formed to cover the surface portion of the base table 50 and the sacrificial layer 52, as shown in FIG. 5(b). This second photolithography mask 56 forms on the aforementioned surface of the base table 50 a planar shape in which the probe main body portion 22a of the probe 22 and the probe tip reinforcement portion 40 connected to the pedestal portion 34 of the probe main body portion are continuously arrayed.

On the surface portion of the base table 50 exposed from the second photolithography mask 56 is deposited a highly tough metal material 58 such as nickel chrome with approximately the same thickness as that of the sacrificial layer 52 by an electroplating method, as shown in FIG. 5(c). By this deposition of the metal material, an entire shape of the probe main body portion 22a is formed on the base table 50 so that its thickness is approximately one-third as thick as the thickness dimension of the probe main body portion 22a, and the probe tip reinforcement portion 40 is integrally formed on the base table 50 to continue into the pedestal portion 34 of the probe main body portion 22a.

Subsequently, the second photolithography mask 56 is removed, and a third photolithography mask 60 for the probe tip portion 22b is formed so as to expose a predetermined area of the sacrificial layer 52, the probe tip reinforcement portion 40, and the probe main body portion 22a on the base table 50, as shown in FIG. 5(d). This third photolithography mask 60 partially exposes the area of the sacrificial layer 52, the probe tip reinforcement portion 40, and the probe main body portion 22a so as to expose the predetermined area corresponding to a flat surface shape of the probe tip portion 22b.

On the area exposed from the third photolithography mask 60 is deposited a highly hard metal material 62 such as rhodium with predetermined thickness by an electroplating method, as shown in FIG. 5(e). By this deposition of the highly hard metal material 62, the probe tip portion 22b is formed. Since the probe tip portion 22b deposited by the electroplating method is formed and firmly combined with the highly flexible or tough metal material 58, the side surface of the probe tip portion 22b and the probe tip reinforcement portion 40 can be combined fixedly and firmly without the use of a special adhesive.

After the probe tip portion 22b is formed, the third photolithography mask 60 is removed, and a fourth photolithography mask 64 is newly formed as shown in FIG. 5(f). This fourth photolithography mask 64 exposes an area corresponding to a flat surface shape of the probe main body portion 22a in the area of the deposited highly tough metal material 58 and highly hard metal material 62 in order to form the remaining part of the probe main body portion 22a. In this exposed area by this fourth photolithography mask 64, an area corresponding to the probe tip reinforcement portion 40 is not included as in the case of the first photolithography mask 56, but the area corresponding to the planar shape of only the probe main body portion 22a is exposed.

On the area exposed from the fourth photolithography mask 64 is deposited the same highly tough metal material 58 as the aforementioned one, as a result of which the remaining part of the probe main body portion 22a is formed. As a result, the probe 22 having the probe tip portion 22b and the probe tip reinforcement portion 40 is formed on the base table 50, as shown in FIG. 5(g). After the photolithography mask 64 surrounding this probe 22 is removed, and the sacrificial layer 52 is removed, the probe 22 is detached from the base table 50.

The method for forming the probe 22 is not limited to the aforementioned method, but the probe 22 can be formed by fixing the probe tip reinforcement portion 40 to a conventional probe not having the probe tip reinforcement portion 40, for example. However, by forming the probe 22 according to the present invention by using a photolithography technique and an electroplating method as described above, the present invention can be embodied only by changing the shapes of some of the conventional photolithography masks without adding special manufacturing processes. Moreover, the probe tip reinforcement portion 40 can be combined with the probe main body portion 22a and the probe tip portion 22b without using a special adhesive means.

For relative alignment between the probe assembly 10 and the semiconductor wafer 12, the tip surface 38a of the probe tip portion 22b of the probe assembly 10 is sometimes used as an alignment mark. In such a case, reflected light from the tip surface 38a as an alignment mark is captured by a camera, and alignment of the probe assembly 10 is performed based on this alignment mark image, as described above. At this time, if reflected light from the probe tip reinforcement portion 40 is captured by the aforementioned camera, this causes prevention of accurate recognition of the alignment mark.

FIGS. 6(a) to (g) show various modification examples in which care has been taken so that the reflected light from the lower surface 40a of the probe tip reinforcement portion 40 does not prevent alignment of the probe assembly 10 when the tip surface 38a of the probe tip portion 22b of the probe assembly 10 is used as an alignment mark.

FIG. 6(a) shows an example in which an angular tilting surface 40b is formed with respect to the axis of the column body portion 38 at the lower part of the probe tip reinforcement portion 40 in order to reduce the amount of the reflected light from the lower surface 40a of the probe tip reinforcement portion 40 to the aforementioned camera. By forming the tilting surface 40b on the probe tip reinforcement portion 40, the area of the lower surface 40a, which is parallel to the tip surface 38a of the column body portion 38, can be reduced. Accordingly, the amount of the reflected light from the lower surface 40a, which is directed in the same direction as that of the reflected light from the tip surface 38a of the probe tip portion 22b to the aforementioned camera, can be reduced.

As for FIG. 6(b), by forming the lower surface 40a of the probe tip reinforcement portion 40 into two tilting surface parts 40c, 40c combined to form into a mountain shape protruded downward, the lower surface parallel to the tip surface 38a of the column body portion 38 can be eliminated. Thus, the reflected light from the probe tip reinforcement portion 40 to the aforementioned camera can be removed more effectively.

Also, as shown in FIG. 6(c), by forming the lower surface 40a of the probe tip reinforcement portion 40 into a curved surface 40d swollen downward, the reflected light from the probe tip reinforcement portion 40 to the aforementioned camera can be removed more effectively in the same manner.

FIGS. 6(d) and 6(g) show examples in which the probe tip reinforcement portion 40 is formed within the lateral dimension of the probe tip portion 22b. As shown in FIG. 6(d), by forming the probe tip reinforcement portion 40 along the shape of the probe tip portion 22b, the area of the lower surface 40a of the probe tip reinforcement portion 40 parallel to the tip surface 38a of the probe tip portion 22b can be set to be approximately the same area as that of the tip surface 38a, which enables significant reduction of an influence of the reflected light from the lower surface 40a. Also, by forming the lower surface 40a in FIG. 6(d) into two tilting surface parts 40e, 40e combined to form into a mountain shape as shown in FIG. 6(e), or by forming it into a curved surface 40f swollen downward as shown in FIG. 6(f), the reflected light from the probe tip reinforcement portion 40 to the aforementioned camera can be removed more effectively.

Further, as shown in FIG. 6(g), by using the probe tip reinforcement portion 40 whose lower surface is constituted by the two tilting surface parts 40e, 40e combined to form into a mountain shape, tilting surface parts 34b, 34b combined to form into a mountain shape can be formed at areas of the pedestal portion 34 of the probe main body portion 22a except the center part which is an attachment portion of the probe tip portion 22b. Accordingly, it is possible to reduce alignment interference light caused by the reflected light from the probe tip reinforcement portion 40 and the reflected light from the pedestal portion 34.

Although, in the foregoing description, the present invention has been explained with reference to an example in which the probe tip reinforcement portion 40 is formed on one side of the probe tip portion 22b, the probe tip reinforcement portions 40 may be formed on both sides of the probe tip portion 22b. However, since the probe tip reinforcement portions 40 formed on both sides of the probe tip portion 22b substantially cause the probe tip portion to be short, it is preferable that the probe tip reinforcement portion 40 should be formed on one side of the probe tip portion 22b as shown in the figures. Also, the probe tip reinforcement portions may be formed with the probe tip portion 22b sandwiched in between, for example, in the lateral direction (Y direction) of the probe 22, instead of formation of the probe tip reinforcement portion on both sides of the probe tip portion 22b.

Hereinafter, a second invention will be explained with reference to FIGS. 7 to 12. Each probe to be attached to the probe assembly 10 shown in FIG. 1 is shown as a probe 122.

Figure 7:
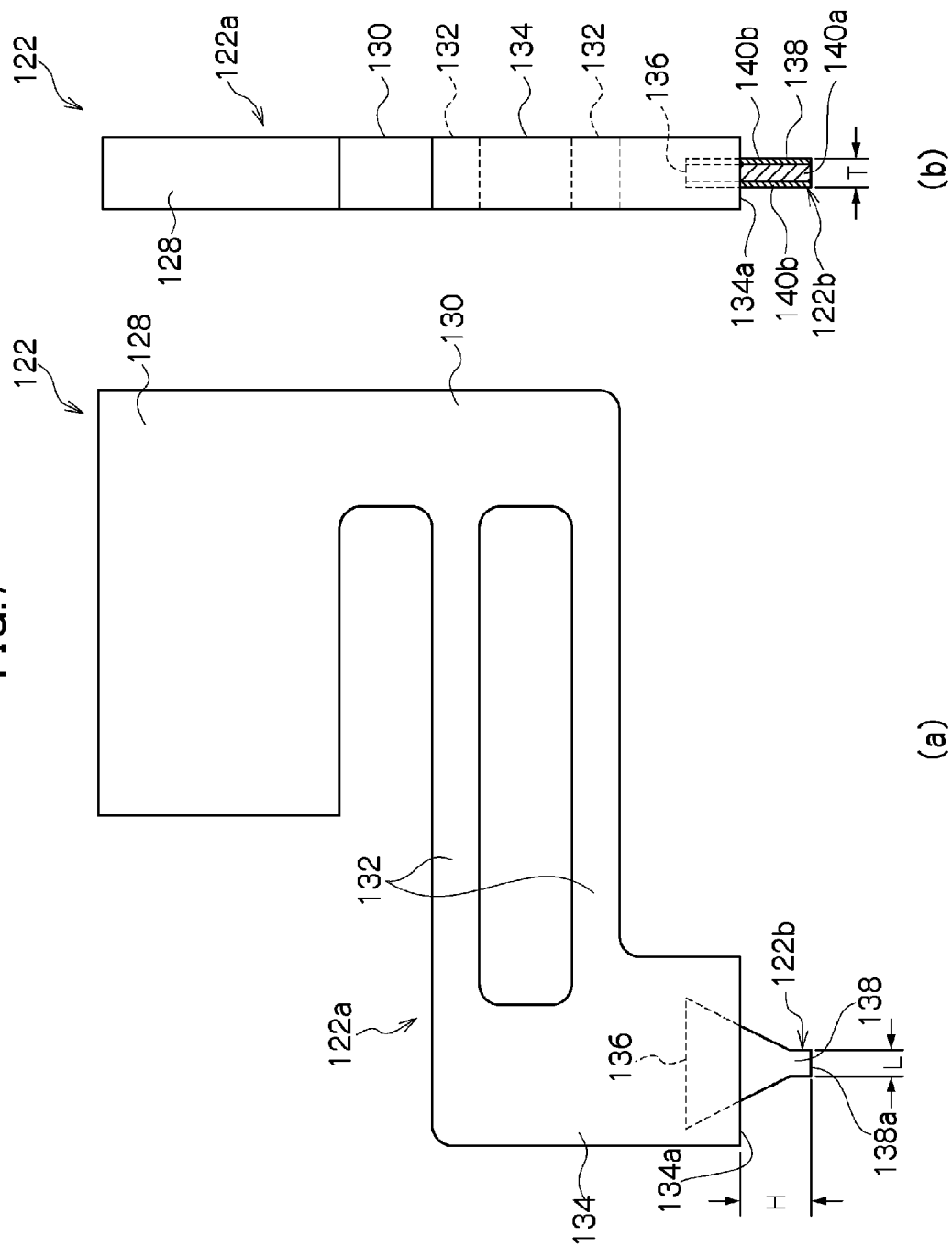
FIG. 7(a) is an enlarged front view of a probe according to a second invention shown in FIG. 1.
FIG. 7(b) is its enlarged side view.

Referring to FIG. 7, each probe 122 comprises a plate-shaped probe main body portion 122a made of a metal material such as nickel or a nickel-chromium alloy and a probe tip portion 122b whose base layer is made of a hard metal material such as rhodium. Both the portions 122a and 122b have relatively good conductivity. The probe main body portion 122a is greater in flexibility or toughness than the rhodium constituting the base layer of the probe tip portion 122b while the rhodium is higher in hardness than the aforementioned metal material constituting the probe main body portion 122a.

The probe main body portion 122a may be made of a highly tough metal material with excellent toughness such as a nickel alloy including, for example, a nickel-phosphorus alloy, a nickel-tungsten alloy, and a nickel-cobalt alloy, phosphor bronze, or a palladium-cobalt alloy, instead of the aforementioned metal material. Also, the base layer of the probe tip portion 122b may be arbitrarily made of a highly hard metal material other than rhodium.

In the example shown in the figure, the probe main body portion 122a comprises a rectangular attachment portion 128 whose lateral direction is a longitudinal direction, a connection portion 130 extending downward from one side of the attachment portion, arm portions 132, 132 extending in a lateral direction from the connection portion with a space along the lower edge of the attachment portion 128, and a pedestal portion 134 connected to the extending ends of the arm portions. Also, in the example shown in the figure, a pair of arm portions 132, 132 formed to be distanced from each other in a height direction of the attachment portion 128, that is, an extending direction of the connection portion 130, is formed as the arm portions. The pedestal portion 134 connecting the extending ends of both the arm portions 132, 132 extends to the opposite side of a side where the attachment portion 128 is located, when seen from the pair of arm portions 132.

The extending end of this pedestal portion 134 is a flat end surface 134a, and the probe tip portion 122b is provided to be protruded from this end surface. The probe tip portion 122b comprises a base portion 136 having a trapezoidal planar shape whose dimension in a lateral direction gradually decreases toward the protruding direction and a column body portion 138 having a rectangular planar shape extending from the shorter side of a parallel opposite sides pair of the base portion, as shown in FIG. 7(a). The tip surface of the column body portion 138 is a flat surface 138a approximately perpendicular to the axis of the column body portion 138 in the example shown in FIGS. 7(a) and (b). For example, the height dimension H of the probe tip portion 122b protruded from the pedestal portion 134 is 35±3 μm, the thickness dimension T of the probe tip portion 122b is about 15 μm or 12.5 μm, and the lateral dimension L of the column body portion 138 is 15±2 μm. These dimensions H, T, and L can be selected arbitrarily. Also, the tip surface of the column body portion 138 may be in a spherical shape protruded downward or in a spired shape.

Figure 8:
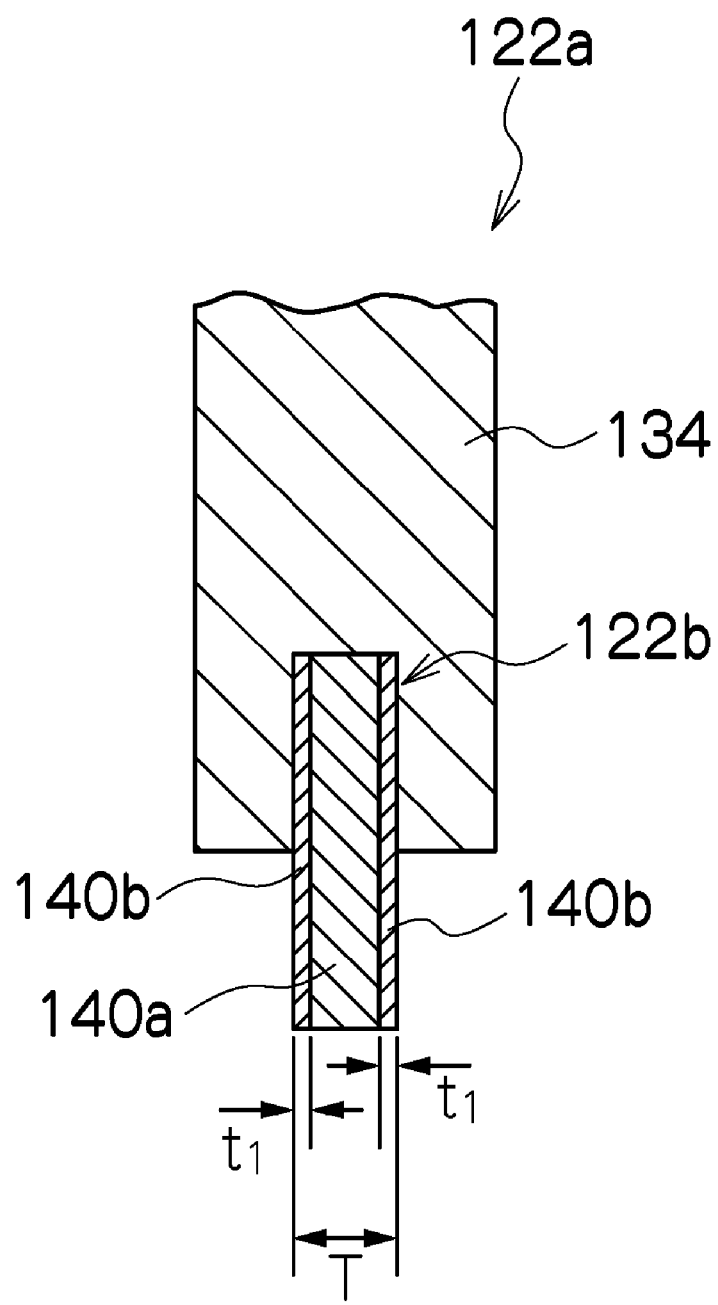
FIG. 8 is an enlarged cross-sectional view showing the probe tip portion of the probe shown in FIG. 7.

The probe tip portion 122b is in a multi-layer structure having a base layer made of the aforementioned highly hard material across the entire portions of the base portion 136 and column body portion 138, as shown in FIGS. 7(b) and 8. That is, the probe tip portion 122b is in a multi-layer structure having three layers consisting of a first metal material layer 140a made of a hard metal material such as the aforementioned rhodium and a pair of second metal material layers 140b, 140b arranged to cover both sides of the first metal material layer as a base layer in the example shown in FIGS. 7 and 8. The respective layers 140a and 140b are sequentially layered in the plate thickness direction of the probe main body portion 122a. The edge portion side including the longer side of the aforementioned parallel opposite sides pair of the base portion 136 is buried in the pedestal portion 134 of the probe main body portion 122a such that the column body portion 138 of the probe tip portion 122b is protruded from the end surface 134a of the pedestal portion 134. In this manner, the probe tip portion 122b is fixed to the probe main body portion 122a.

Both the metal material layers 140b of the probe tip portion 122b are made of a highly tough metal material and are mutually fixed to the first metal material layer 140a between both the layers. It is preferable that both the metal material layers 140b should be made of the same metal material as that of the probe main body portion 122a with the aim of integration between both the metal material layers 140b and the probe main body portion 122a in order to increase the bond strength between the probe tip portion 122b and the probe main body portion 122a and with the aim of simplification of manufacturing facilities described later.

When the thickness dimension T of the probe tip portion 122b is about 15 μm or 12.5 μm as described above, the second metal material layers 140b, 140b each having a thickness dimension t1 of 1 to 2 μm, for example, are formed. The thickness dimension of the first metal material layer 140a has a value derived by subtracting the thickness dimensions t1 of both the second metal material layers 140b, 140b from the thickness dimension T of the probe tip portion 122b (T−2t1).

The first metal material layer 140a made of a hard metal material, which is a base layer of the probe tip portion 122b, functions mainly as an abrasion-resistant layer for the probe tip portion as a core material of the probe tip portion 122b. Also, the second metal material layers 140b, 140b covering both the side surfaces of the first metal material layer 140a prevent the first metal material layer 140a from being cracked or damaged by absorbing impact from outside by making use of their toughness.

As shown in FIG. 9(a), the second metal material layers 140b, 140b each having a thickness dimension t2 of 2 to 3 μm, for example, may be formed without changing the thickness dimension T of the probe tip portion 122b.

Also, as shown in FIG. 9(b), the probe tip portion 122b having five layers in total may be used by layering two first metal material layers 140a and three second metal material layers 140b alternately without changing the thickness dimension T of the probe tip portion 122b. A thickness dimension t1 of each of the three second metal material layers 140b may be 1 to 2 μm, which is the same as the thickness dimension in the example shown in FIG. 8, for example.

Further, as shown in FIG. 9(c), the probe tip portion 122b having two layers consisting of a single first metal material layer 140a and a single second metal material layer 140b may be formed without changing the thickness dimension T of the probe tip portion 122b. A thickness dimension t of this single first metal material layer 140a may be selected as desired in the range of 1 to 3 μm, for example.

In either example, a multi-layer structure having as many first metal material layers 140a and second metal material layers 140b as desired may be adopted in order to provide the probe tip portion 122b with desired toughness and abrasion resistance. Also, the thickness dimensions of the first metal material layers 140a and the second metal material layers 140b and the thickness dimension T of the probe tip portion 122b may be set arbitrarily as needed.

Each probe 122 according to the present invention is fixed on the probe board 20 (refer to FIG. 1) so that the upper edge of the attachment portion is connected to the aforementioned conductive path in the probe board 20. The probe assembly 10 to which this probe 122 has been provided is used so that the tip surface 138a of the probe tip portion 122b, which is a probe tip of each probe 122, may abut on the corresponding electrode 12a (refer to FIG. 1), as described above.

In a case where one semiconductor wafer 12 is divided into plural chip areas, and each chip area undergoes an electrical test by the probe assembly 10, it sometimes occurs that some probes 122 deviate from the chip area and that the probe tips 138a of the probes 122 come to a position corresponding to a tilting edge of the semiconductor wafer 12. When the probe assembly 10 is thrust upon the semiconductor wafer 12 by an overdrive that causes elastic deformation of the arm portions 132 of each probe 122 in such a state, the tip surface 138a of the probe 122 corresponding to the aforementioned tilting edge is guided by the aforementioned tilting edge. Due to this guide effect of the tilting edge, an overload causing bend may act on the probe tip portion 122b of this probe 122.

In the probe 122 according to the present invention, even if such an overload acts on the probe tip portion 122b, the highly tough second metal material layers 140b covering the first metal material layer 140a having excellent abrasion resistance prevent the first metal material layer 140a from being cracked or damaged. Thus, since breakage and defect in the first metal material layer 140a caused by this crack or damage can be prevented from occurring, defect and breakage of the probe tip portion 122b are prevented to enhance the durability of the probe 122.

Figure 10:
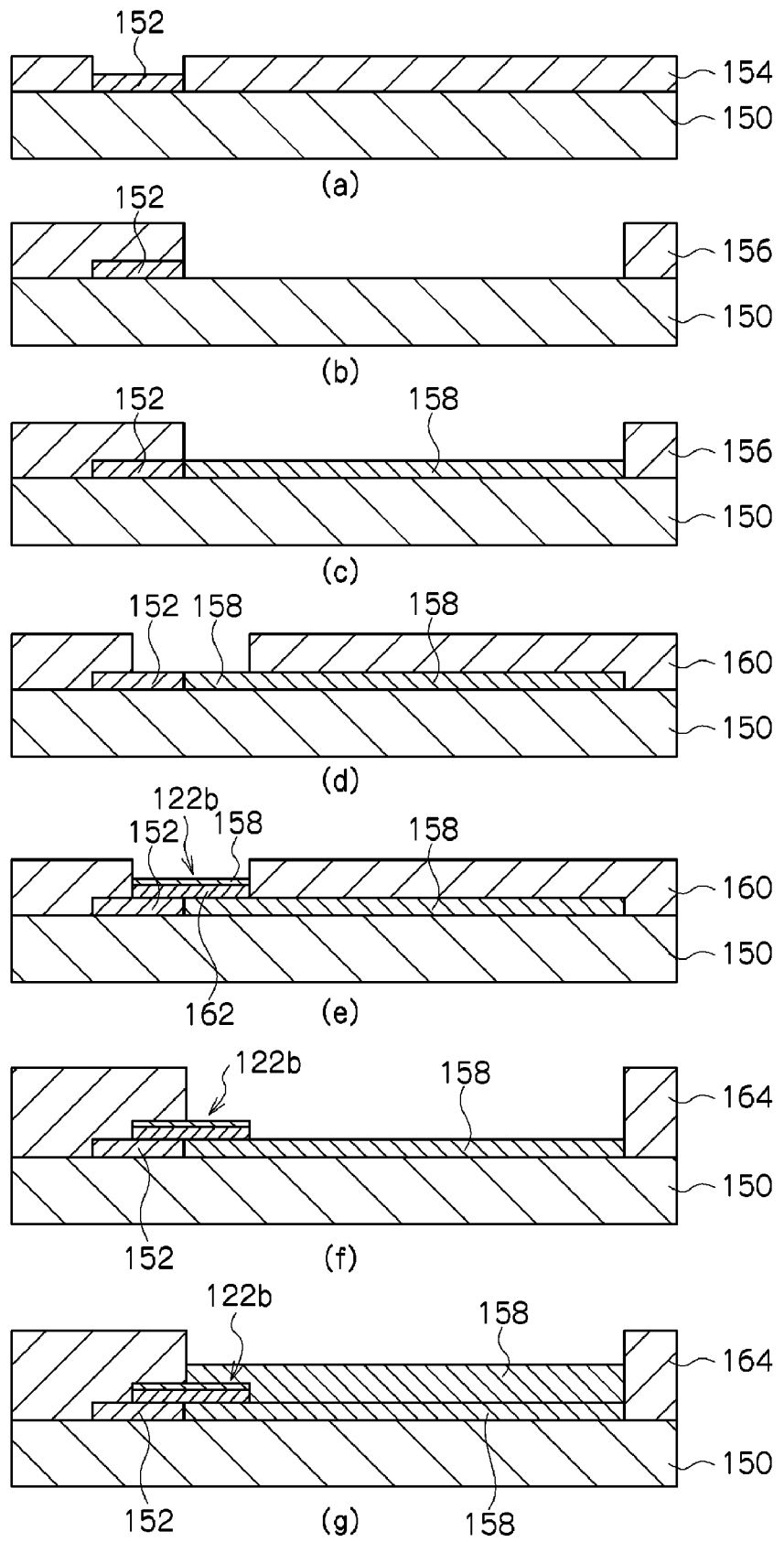
FIG. 10 shows a manufacturing process for the probe shown in FIGS. 7 to 9.

An example of a method for manufacturing the probe 122 is explained with reference to the manufacturing process figure in FIG. 10. As shown in FIG. 10(a), a photolithography mask 154 for a sacrificial layer 152 to be removed later is formed on a base table 150 having a stainless-steel flat surface through a conventionally well-known selective exposure and development process to a photoresist layer. A sacrificial layer material such as copper is deposited on the surface portion of the base table 150 exposed from the photolithography mask 154 with a predetermined thickness by an electroplating method, as a result of which the sacrificial layer 152 is formed.

After the photolithography mask 154 is removed, a new second photolithography mask 156 is formed to cover the surface portion of the base table 150 and the sacrificial layer 152, as shown in FIG. 10(b). This second photolithography mask 156 forms on the aforementioned surface of the base table 150 a planar shape of the probe main body portion 122a having the attachment portion 128, the connection portion 130, the pair of arm portions 132, and the pedestal portion 134.

On the surface portion of the base table 150 exposed from the second photolithography mask 156 is deposited a highly tough metal material 158 such as nickel chrome with approximately the same thickness as that of the sacrificial layer 152 by an electroplating method, as shown in FIG. 10(c). By this deposition of the metal material, an entire shape of the probe main body portion 122a is formed on the base table 150 so that its thickness is approximately one-third as thick as the thickness dimension of the probe main body portion 122a, for example.

Subsequently, the second photolithography mask 156 is removed, and a third photolithography mask 160 for the probe tip portion 122b is formed so as to expose a predetermined area of the sacrificial layer 152 and the probe main body portion 122a on the base table 150, as shown in FIG. 10(d). This third photolithography mask 160 partially exposes the area of the sacrificial layer 152 and the probe main body portion 122a so as to expose the predetermined area corresponding to the planar shape of the probe tip portion 122b.

On the area exposed from the third photolithography mask 160 are sequentially deposited a highly hard metal material 162 such as rhodium and the highly tough metal material 158 with predetermined thickness by an electroplating method, as shown in FIG. 10(e). In this process, in order to form the two-layer probe tip portion 122b shown in FIG. 9(c) for example, the highly hard metal material 162 and the highly tough metal material 158 are sequentially deposited so that each of them may form a single layer with predetermined thickness. Also, in order to form the three-layer probe tip portion 122b shown in FIGS. 8 and 9(a) or the five-layer probe tip portion 122b shown in FIG. 9 (b) for example, the highly hard metal material 162 and the highly tough metal material 158 are sequentially deposited with predetermined thickness repetitively in accordance with the required number of layers.

By this deposition of the highly hard metal material 162 and the highly tough metal material 158, the probe tip portion 122b having a multi-layer structure of the first metal material layer(s) 140a and the second metal material layer(s) 140b is formed. Since the probe tip portion 122b deposited by the electroplating method is formed so that the first metal material layer(s) 140a and the second metal material layer(s) 140b are firmly combined with one another as a result of their deposition, the layer(s) 140a and the layer(s) 140b can be combined with one another without the use of a special adhesive, and the side surfaces of the probe tip portion 122b and the highly tough metal material 158 for the probe main body portion 122a can be combined with one another fixedly and firmly.

After the probe tip portion 122b is formed, the third photolithography mask 160 is removed, and a fourth photolithography mask 164 is newly formed as shown in FIG. 10(f). This fourth photolithography mask 164 exposes an area corresponding to the planar shape of the probe main body portion 122a, which is an area including a portion of the deposited probe tip portion 122b that will be buried in the probe main body portion 122a, in order to form the remaining part of the probe main body portion 122a.

Figure 9:
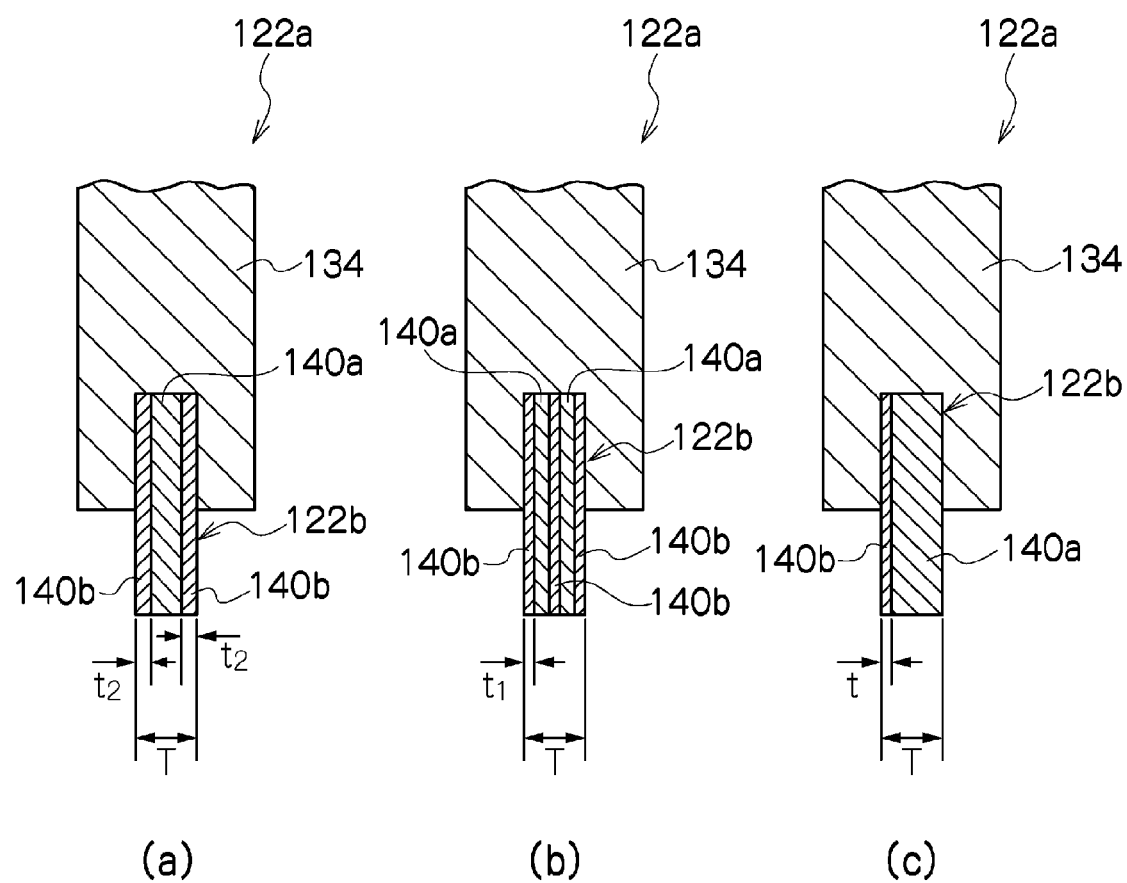
FIGS. 9(a) to (c) are similar views to FIG. 8 showing other embodiments of the second invention.

On the area exposed from the fourth photolithography mask 164 is deposited the same highly tough metal material 158 as the aforementioned one, as a result of which the remaining part of the probe main body portion 122a is formed. As a result, the probe 122 comprising the probe tip portion 122b having the multi-layer structure as shown in FIGS. 8 and 9 and the probe main body portion 122a is formed on the base table 150, as shown in FIG. 10(g). After the photolithography mask 164 surrounding this probe 122 is removed, and the sacrificial layer 152 is removed, the probe 122 is detached from the base table 150.

The second metal material layer 140b may be a metal material layer made of a different tough metal material from the metal material of the probe main body portion 122a. However, in the case of forming the probe 122 by using a photolithography technique and an electroplating method as described with reference to FIG. 10, by forming the probe main body portion 122a and the second metal material layer 140b of the probe tip portion 122b with the same metal material as described above, both the portions 122a and 140b can be combined firmly without using a special adhesive means. Also, the kind of component materials can be simplified more than in a case where the second metal material layer 140b is made of a different tough metal material from the probe main body portion 122a. Thus, its manufacturing facilities can be simplified.

A multi-layer structure consisting of the first metal material layer 140a and the second metal material layer(s) 140b in a similar manner as one described above can be applied to a probe tip portion 122b having a conventionally well-known crank-shaped cross-sectional shape as shown in FIGS. 11(a) and (b), instead of the probe tip portion 122b having a linear cross-sectional shape as shown in FIGS. 8 and 9.

Figure 12:
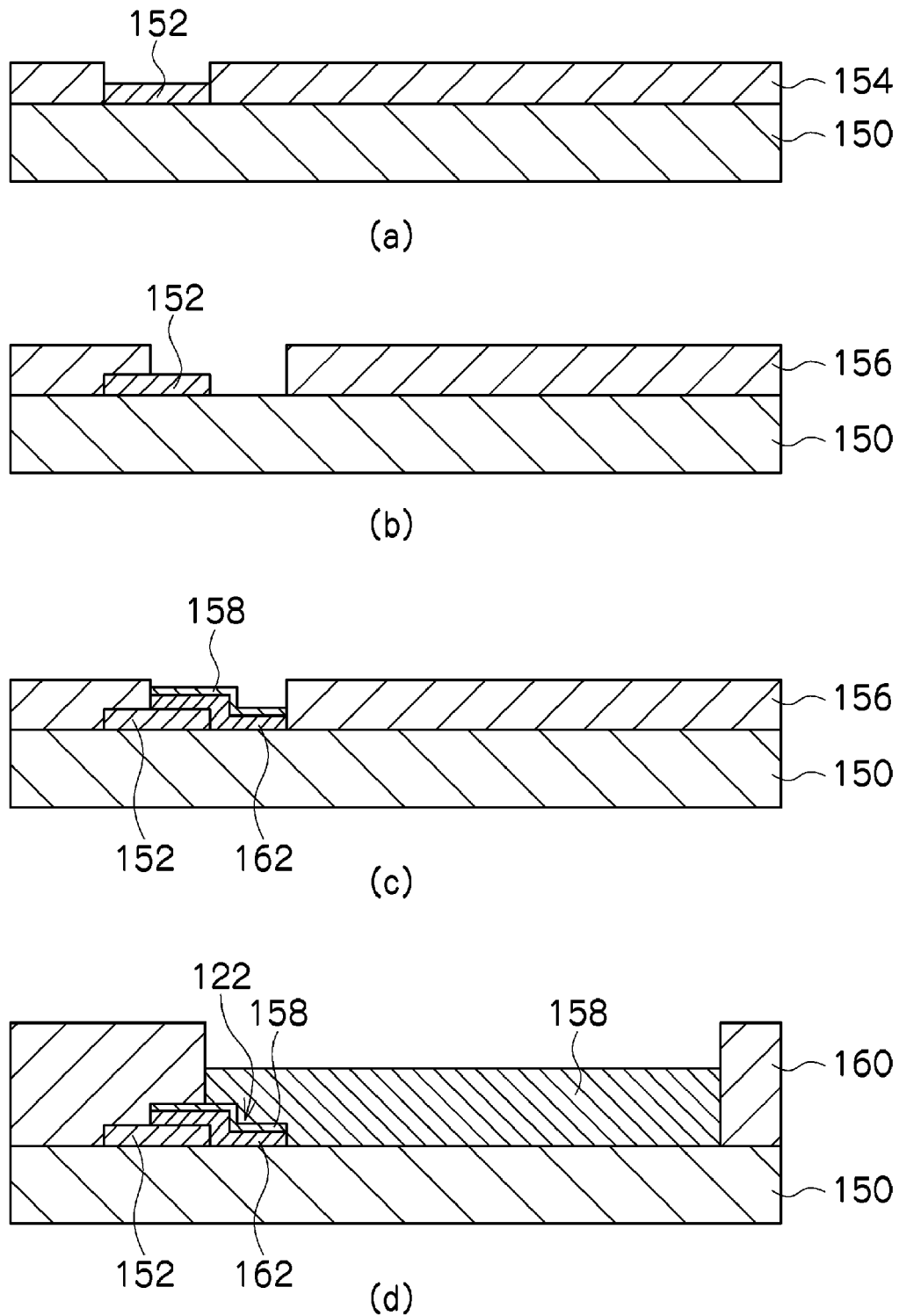
FIG. 12 shows a manufacturing process for the probe shown in FIG. 11.

An example of a process for manufacturing the probe 122 having such a probe tip portion 122b whose cross-section is in a crank shape is shown in FIG. 12. As shown in FIG. 12(a), a photolithography mask 154 for a sacrificial layer 152 is formed on a similar base table 150 to one shown in FIG. 10(a). The sacrificial layer 152 is formed on the surface portion of the base table 150 exposed from the photolithography mask 154 by an electroplating method.

After the photolithography mask 154 is removed, a new second photolithography mask 156 is formed to cover the surface portion of the base table 150 and the sacrificial layer 152, as shown in FIG. 12(b). In this process, for formation of the probe tip portion 122b having a crank-shaped cross-sectional shape, the second photolithography mask 156 is formed so as to expose a half of the sacrificial layer 152 in the longitudinal direction.

On the surface portion of the base table 150 exposed from the second photolithography mask 156 and the area on the sacrificial layer 152 exposed from the second photolithography mask 156 are sequentially deposited a highly hard metal material 162 such as rhodium and a highly flexible metal material 158 with predetermined thickness by an electroplating method, as shown in FIG. 12(c). In the example shown in FIG. 12(c), in order to form the two-layer probe tip portion 122b, the highly hard metal material 162 and the highly tough metal material 158 are sequentially deposited so that each of them may form a single layer with a predetermined thickness. However, in the same manner as that in the example described with reference to FIG. 10, the highly hard metal material 162 and the highly tough metal material 158 are sequentially deposited with a predetermined thickness repetitively in accordance with the required number of layers.

By this deposition of the highly hard metal material 162 and the highly tough metal material 158, the probe tip portion 122b having a multi-layer structure of the first metal material layer 140a and the second metal material layer 140b is formed. When the highly hard metal material 162 and the highly tough metal material 158 are to be deposited for formation of this probe tip portion 122b, a step is formed by the sacrificial layer 152 at the exposed area by the second photolithography mask 156. Thus, the probe tip portion 122b having a multi-layer structure and having a crank-shaped cross-sectional shape as shown in FIGS. 11(a) and (b) is formed.

After the probe tip portion 122b is formed, the second photolithography mask 156 is removed, and a third photolithography mask 160 is newly formed as shown in FIG. 12(d). This third photolithography mask 160 exposes an area corresponding to a flat surface shape of the probe main body portion 122a, which is an area including a portion of the deposited probe tip portion 122b that will be buried in the probe main body portion 122a, in order to form the probe main body portion 122a.

Figure 11:
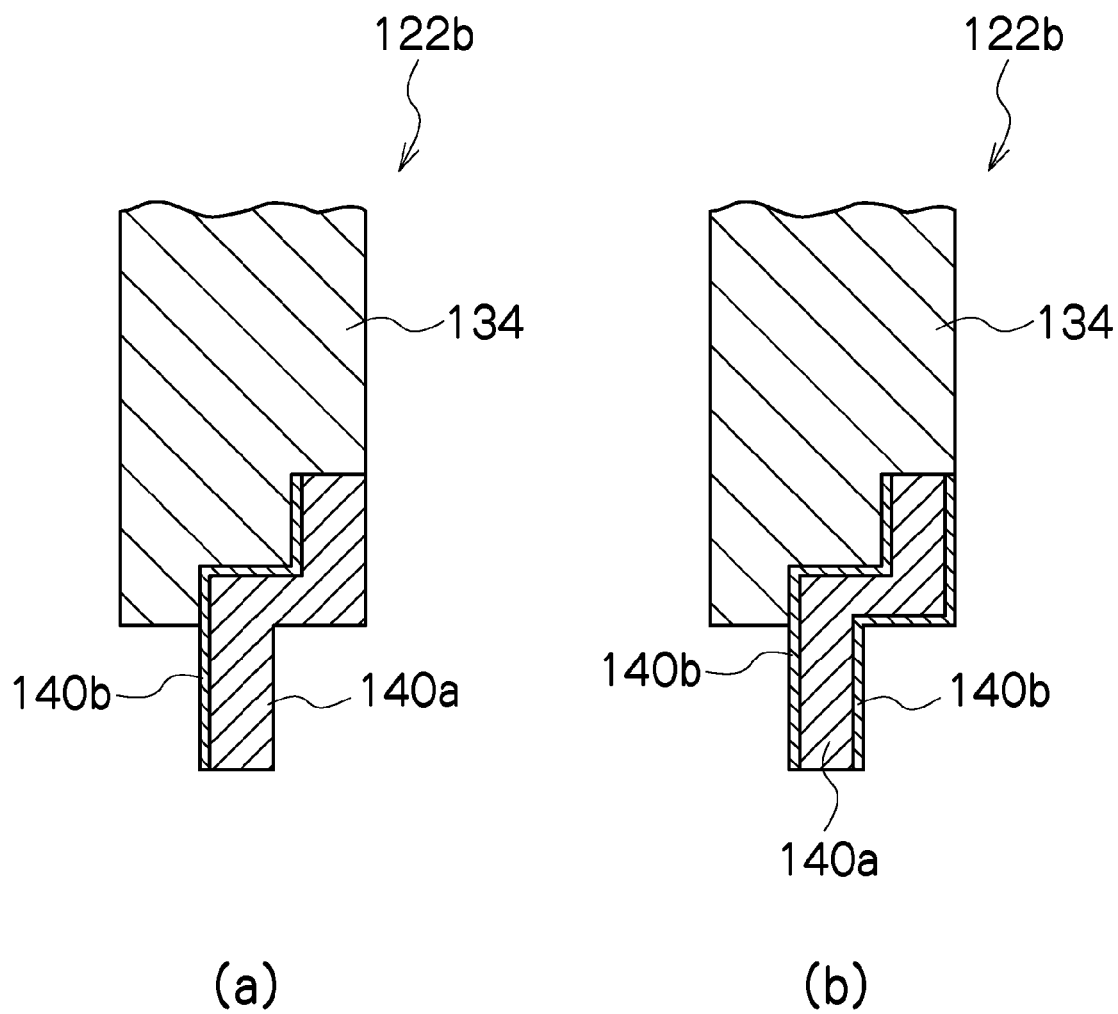
FIGS. 11(a) and (b) are similar views to FIGS. 9(a) to (c) showing further embodiments of the second invention.
FIG. 11(b) shows an embodiment of a three-layer structure.

On the area exposed from the third photolithography mask 160 is deposited the same highly tough metal material 158 as the aforementioned one, as a result of which the probe main body portion 122a having an attachment portion 128, a connection portion 130, a pair of arm portions 132, and a pedestal portion 134 is formed. Subsequently, the photolithography mask 160 surrounding this probe 122 is removed, the sacrificial layer 152 is removed, and thereafter the probe 122 is detached from the base table 150. As a result, the probe 122 consisting of the probe tip portion 122b having a multi-layer structure and having a crank-shaped cross-sectional shape as shown in FIG. 11 and the probe main body portion 122a is formed.

The present invention is not limited to the above embodiments but may be altered in various ways without departing from the spirit and scope of the present invention. Also, the first invention and the second invention can be combined. In such a case, the aforementioned probe tip reinforcement portion 40 is provided on the pedestal portion of the probe, and the aforementioned multi-layer structure is adopted for the probe tip portion of the probe.

What is claimed is:

1. An electrical test probe comprising:
  a probe main body portion having a pedestal portion with a flat end surface; and
  a probe tip portion formed in the pedestal portion and protruding from the flat end surface of the pedestal portion,
  wherein said probe main body portion is made of a first conductive material that is greater in toughness than said probe tip portion, and said probe tip portion is made of a second conductive material that is higher in hardness than the material of said probe main body portion, the second conductive material being different than the first conductive material, and
  wherein on said pedestal portion is provided a probe tip reinforcement portion which extends in an exposed manner from the flat end surface of the pedestal portion toward a tip of the probe tip portion and contacts only one side surface of said probe tip portion, and permits the tip of said probe tip portion to be protruded from an extending end of said probe tip reinforcement portion in the extending direction.

2. The electrical test probe according to claim 1, wherein said probe tip reinforcement portion is made of the same material as that of said pedestal portion and is formed integrally with said pedestal portion.

3. The electrical test probe according to claim 1, wherein said probe tip reinforcement portion is fixed to said probe tip portion.

4. The electrical test probe according to claim 1, wherein said probe main body portion is constituted by a plate-shaped member, and the internal side of said reinforcement portion is arranged along said probe tip portion, and its external side is arranged to correspond to one side surface of said probe main body portion.

5. The electrical test probe according to claim 1, wherein the tip of said probe tip portion has a flat surface approximately perpendicular to the extending direction, and an end surface of said reinforcement portion located on the tip side of said probe tip portion is a curved surface.

6. The electrical test probe according to claim 1, wherein the tip of said probe tip portion has a flat surface approximately perpendicular to the extending direction, and the end surface of said reinforcement portion located on the tip side of said probe tip portion has an angular tilting surface part with respect to the flat surface of said tip.

7. The electrical test probe according to claim 1, wherein said probe tip portion is formed such that a part of it is buried in said pedestal portion.

8. The electrical test probe according to claim 1, wherein said probe main body portion comprises an attachment portion and a pair of arm portions extending in a lateral direction from said attachment portion to be distanced from each other in a height direction of said attachment portion, and said pedestal portion is formed to extend to the opposite side of a side where said attachment portion is located, when seen from said arm portions, so as to connect extending ends of said arm portions.

9. An electrical test probe assembly comprising:
a probe board in which a plurality of conductive paths are formed; and
an electrical test probe according to claim 1, provided on said probe board and is electrically connected to said corresponding conductive path.

10. An electrical test probe comprising:
a probe main body portion having a pedestal portion with a flat end surface;
a probe tip portion formed in the pedestal portion and protruding from the flat end surface of the pedestal portion, wherein the probe main body portion is made of conductive material that is greater in toughness than the probe tip portion, and wherein the probe tip portion is made of conductive material that is higher in hardness than the probe main body portion; and
a probe tip reinforcement portion that is integrally formed with the probe main body portion, and which extends in an exposed manner from the flat end surface of the pedestal portion toward a tip of the probe tip portion and on only one side of the probe tip portion; wherein
the probe tip reinforcement portion includes an inward surface that abuts only one side surface of the probe tip portion;
the probe tip reinforcement portion extends from the flat end surface of the pedestal portion by a first distance; and
the probe tip portion extends from the flat end surface of the pedestal portion by a second distance that is greater than the first distance, such that the tip of the probe tip portion protrudes from an extending end of the probe tip reinforcement portion.

* * * * *